(12) United States Patent
Gonen et al.

(10) Patent No.: US 9,325,340 B2
(45) Date of Patent: *Apr. 26, 2016

(54) EFFICIENT ANALOG TO DIGITAL CONVERTER

(71) Applicant: NXP B.V., Eindhoven (NL)

(72) Inventors: Burak Gonen, Delft (NL); Fabio Sebastiano, Rotterdam (NL); Kofi Afolabi Anthony Makinwa, Delft (NL); Robert Hendrikus Margaretha van Veldhoven, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/475,180

(22) Filed: Sep. 2, 2014

(65) Prior Publication Data

US 2016/0065231 A1 Mar. 3, 2016

(51) Int. Cl.
*H03M 1/12* (2006.01)
*H03M 1/14* (2006.01)
*H03M 3/00* (2006.01)
*H03M 1/38* (2006.01)

(52) U.S. Cl.
CPC ........ *H03M 1/14* (2013.01); *H03M 1/38* (2013.01); *H03M 3/458* (2013.01)

(58) Field of Classification Search
CPC .......... H03M 1/14; H03M 3/458; H03M 1/38
USPC .................................................. 341/155, 156
See application file for complete search history.

(56) References Cited

U.S. PATENT DOCUMENTS

| | | | |
|---|---|---|---|
| 5,006,853 A * | 4/1991 | Kiriaki et al. | 341/156 |
| 6,999,019 B2 * | 2/2006 | Cosand | 341/156 |
| 7,176,819 B1 * | 2/2007 | Swerlein et al. | 341/143 |
| 7,324,036 B2 * | 1/2008 | Petre et al. | 341/155 |
| 8,665,130 B2 | 3/2014 | Makinwa et al. | |
| 2007/0024484 A1 | 2/2007 | Liu | |
| 2008/0143576 A1 | 6/2008 | Chen et al. | |
| 2010/0182175 A1 | 7/2010 | Oo et al. | |

FOREIGN PATENT DOCUMENTS

EP 2629430 A2 8/2013

OTHER PUBLICATIONS

Chae, Y. et al. "A 6.3 μW 20 bit Incremental Zoom-ADC with 6 ppm INL and 1 μV Offset", IEEE J. of Solid-State Circuits, vol. 48, No. 12, pp. 3019-3027 (Dec. 2013).
Bruce II, J.W. "Dynamic Element Matching Techniques for Data Converters", Graduate College, University of Nevada Las Vegas, 271 pgs. (2000).
Extended European Search Report for Patent Appln. No. 15180900.1 (Feb. 4, 2016).

* cited by examiner

*Primary Examiner* — Brian Young

(57) ABSTRACT

An efficient analog to digital converter is disclosed. The efficient analog to digital converter includes a coarse analog to digital converter coupled to an input analog signal. The coarse analog to digital converter is configured to provide an approximate digital representation of the input analog signal. The efficient analog to digital converter also includes a fine analog to digital converter coupled to the input analog signal. The output of the coarse analog to digital converter is coupled to the fine analog to digital converter. The fine analog to digital converter is configured to set input range of the fine analog to digital converter as a function of the output of the coarse analog to digital converter.

12 Claims, 2 Drawing Sheets

EFFICIENT ANALOG TO DIGITAL CONVERTER

BACKGROUND

Analog-to-Digital Converters (ADC) are basic building blocks used in several electronic systems to convert analog signals into the digital domain, thus enabling further digital processing on the converted signals. Typical applications include sensors, such as temperature sensors, humidity sensors, pressure sensors, microphones, baseband of radio receivers and digital instrumentation tools.

The energy or the power available for the ADC is limited in several applications, for example in battery-powered systems. Thus, ADC architectures with the highest energy efficiency are preferred. Successive-Approximation ADCs (SAR ADC) exhibit the best energy efficiency but their resolution is typically below 12 bits, thus making them not suitable for applications requiring higher resolution. If higher resolutions are required, Sigma Delta ADCs are preferred. Even if Sigma Delta ADCs show lower energy efficiency than SAR ADCs, Sigma Delta ADCs can offer higher resolution, typically up to 20 bits or more. Circuit designers choose either SAR ADC or Sigma Delta ADC for a particular application based on the suitability parameters.

An ADC is defined by its bandwidth that is, the range of frequencies it can measure, and its signal to noise ratio that is, how accurately it can measure a signal relative to the noise it introduces. The actual bandwidth of an ADC is characterized primarily by its sampling rate, and to a lesser extent by how it handles errors such as aliasing. The dynamic range of an ADC is influenced by many factors, including the resolution (the number of output levels it can quantize a signal to), linearity and accuracy (how well the quantization levels match the true analog signal) and jitter (small timing errors that introduce additional noise).

One of the main performance parameter of an ADC is its resolution, usually expressed in bits. For an ADC with a resolution of n bits and with input range between $V_{min}$ and $V_{max}$, i.e., an ADC whose allowed input signal Vin must be $V_{min} \leq V_{in} \leq V_{max}$, the standard deviation of the noise introduced in the analog-to-digital conversion can be represented by the equation:

$$n_{std} = \alpha \frac{V_{max} - V_{min}}{2^n - 1}, \alpha = \frac{1}{\sqrt{12}}$$

Thus, a lower noise can be achieved by increasing the ADC resolution (n) or by decreasing the ADC input range ($V_{min}$-$V_{max}$).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, an efficient analog to digital converter is disclosed. The efficient analog to digital converter includes a coarse analog to digital converter coupled to an input analog signal. The coarse analog to digital converter is configured to provide an approximate digital representation of the input analog signal. The efficient analog to digital converter also includes a fine analog to digital converter coupled to the input analog signal. The output of the coarse analog to digital converter is coupled to the fine analog to digital converter. The fine analog to digital converter is configured to set input range of the fine analog to digital converter as a function of the output of the coarse analog to digital converter.

In another embodiment, an analog to digital converter is disclosed. The analog to digital converter includes an input terminal for receiving an analog input signal, an input reference signal terminal for receiving a digital reference signal that is an approximate digital representation of the analog input signal, a digital to analog converter coupled to the input reference signal terminal and a feedback loop including a quantizer that is couples to the digital to analog converter. The output of the digital to analog converter is coupled to the input of the quantizer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
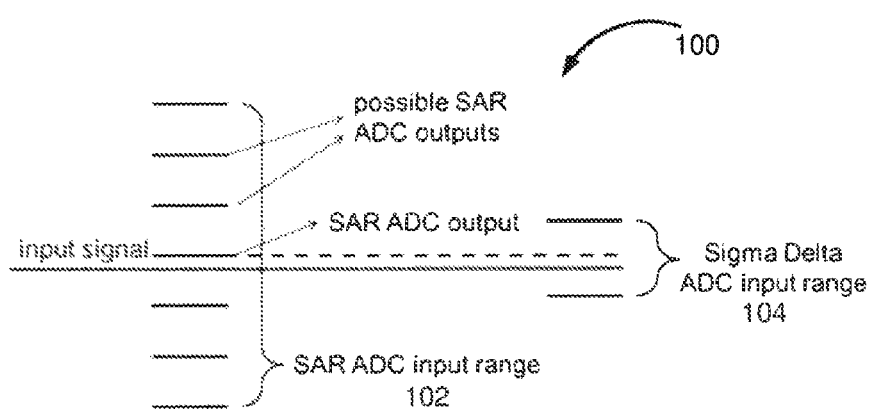
FIG. 1 illustrates operating principles of the efficient Analog-to-Digital Converter (eADC)

FIG. 1 illustrates the input and output voltage ranges 100 of an efficient Analog-to-Digital Converter (eADC). In order to obtain ADC with both high resolution and high power efficiency, the eADC architecture combines the principles of two different types of analog to digital converters such as a SAR ADC and a Sigma Delta ADC, in a particular manner, as described in various embodiments herein. In other embodiments, the two analog to digital converters may be of same type but designed differently in that one is optimized for energy efficiency and another for resolution. The terms "SAR ADC" and "Sigma Delta ADC" are being used herein merely for easy explanation. In the eADC architecture described herein, a SAR ADC performs a first conversion of the analog input and a Sigma Delta ADC performs a second more accurate conversion by using the result of the SAR conversion. The input range 102 of the SAR ADC is equal to the input range of the eADC. The output of the SAR ADC is used as a coarse approximation of the analog input signal and this information is used to adjust the input range 104 of a Sigma Delta ADC to include the analog input. Because of this adjustment, the Sigma Delta input range does not need to cover the full input range of the eADC in that the input range of the Sigma Delta ADC can be smaller than the input range of the eADC. By combining the output of the SAR ADC and the Sigma Delta ADC, an accurate digital representation of the input signal is produced. Since the SAR ADC is only used for adjusting the input range of the Sigma Delta ADC, the accuracy and noise of the converter is determined only by the accuracy and noise of the Sigma Delta ADC.

Thus, the input range of the eADC is defined by the SAR ADC 202, while the noise introduced in the analog-to-digital conversion is defined by the Sigma Delta ADC 204. A person skilled in the art would appreciate that the energy required by an analog-to-converter mainly depends on its resolution, i.e., the energy requirements depend on the ratio between the input range and the noise introduced by an analog-to-converter. Thus, compared to a standard analog-to-converter with the same resolution, the eADC described herein requires less energy because 1) the Sigma Delta ADC can have a lower resolution than the eADC due to a lower input range being used by the eADC and 2) because of the limited requirements on the coarse ADC, the coarse ADC can be implemented with an efficient architecture (such as a SAR) with negligible energy contribution.

Figure 2:
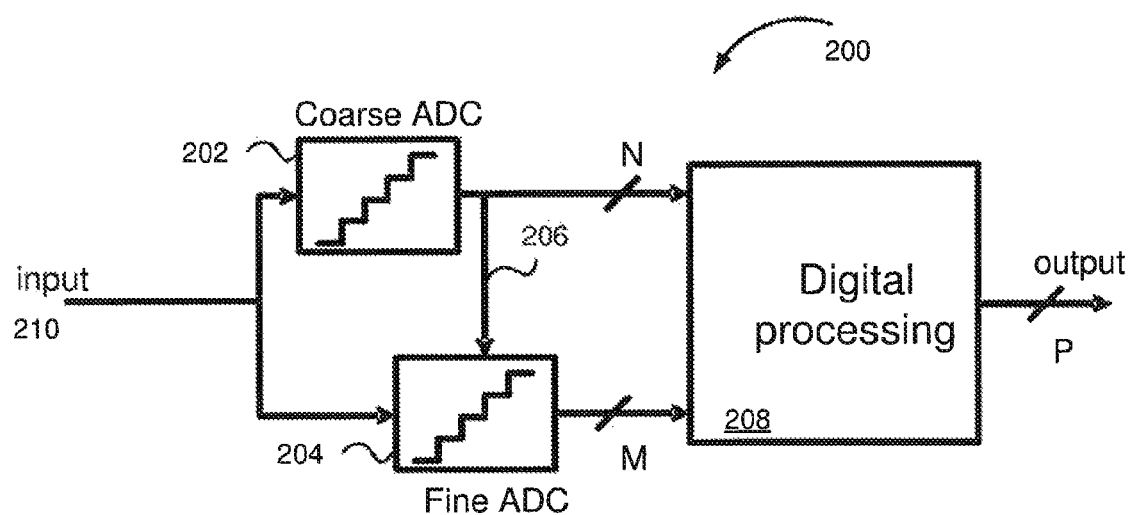
FIG. 2 a schematic of the eADC in accordance with one or more embodiments.

FIG. 2 illustrates an efficient Analog-to-Digital Converter (eADC) 200. As depicted, a coarse ADC 202 with sampling rate $f_{coarse}$ and a fine ADC 204 with sampling rate $f_{fine} \geq f_{coarse}$ run in parallel. Inputs to the coarse ADC 202 and the fine ADC 204 are coupled to a same input source 210. The output 206 of the coarse ADC 202 is also inputted to the fine ADC 204 as a reference signal. The output 206 of the coarse ADC provides an approximation of the input signal 210. The input range of the fine ADC is adapted to include the approximate position found by the coarse ADC. Since the input range of the fine ADC is smaller than the input range of the input signal 210, the fine ADC 204 can consume less energy than a standard ADC with the same resolution and input range of the ADC 200. A digital processing block 208 combines the digital output $D_{coarse}$ (composed of N bits) of the coarse ADC 202 with the digital output word $D_{fine}$ (composed of M bits) of the fine ADC to generate the digital output of the whole converter (composed of P≥N+M bits).

In one embodiment, the reference signal 206 is used to adjust the effective input range of the fine ADC 204. For example, if the fine ADC uses references $V_P$ and $V_N$, the input range of the fine ADC 204 is between $$V_{max} = \alpha V_P$$

and $$V_{min} = \beta V_N,$$

i.e., $V_{in}$ is in the input range of the fine ADC 204 if $V_P \geq V_{max} \geq V_{in} \geq V_n$. Thus, to properly adapt its input range, the references of the fine ADC 204 are chosen as a function of the output $D_{coarse}$ of the coarse ADC 202. In particular, they are chosen so that the following inequality holds:

$$V_{max} \geq f_{coarse}^{-1}(D_{coarse}) \geq V_{min}$$

where $f_{coarse}(\cdot)$ is the input-output transfer function of the coarse ADC 202 and $f_{coarse}^{-1}(\cdot)$ is its inverse. If the input-output transfer function of the coarse ADC $f_{coarse}(\cdot)$ is exactly known, the input range of the fine ADC can be chosen to include the ADC input voltage, i.e., $V_{max} \geq V_{in} \geq V_{min}$.

For example, the references of the fine ADC 204 can be chosen according to the following expressions:

$$V_P = f_{coarse}^{-1}(D_{coarse}) + V_{over-range,P}$$

$$V_N = f_{coarse}^{-1}(D_{coarse}) - V_{over-range,N}$$

Where $V_{over-range,P}$ and $V_{over-range,N}$ are positive numbers. Any additional error of the coarse ADC (such as non-linearity or noise) can be tolerated by increasing $V_{over-range,P}$ and $V_{over-range,N}$, i.e., by implementing over-ranging. In this way the input range of the fine ADC 204 is enlarged in such a way that the previous inequality is always fulfilled and the input signal always lies inside the input range of the fine ADC 204. Under this condition, the accuracy and the noise of the eADC 200 only depends on the accuracy of the Sigma Delta ADC (i.e., the fine ADC 204) and the accuracy of its references. It should be noted that references do not necessarily be voltages. In some embodiments, the term "reference" may indicate any other type of analog reference such as current reference, resistive reference, charge reference or capacitance reference.

In some examples, while the coarse ADC 202 can be implemented using any ADC architecture, such as a Flash converter, a Sigma Delta converter or a SAR converter, the fine ADC 204 is implemented as an integrating converter, such as a Sigma Delta converter, a slope converter or a dual-slope converter. These terms and corresponding architectures are well known in the art. Therefore, further description is being omitted so as not to obfuscate the embodiments of the present disclosure as described here.

Figure 3:
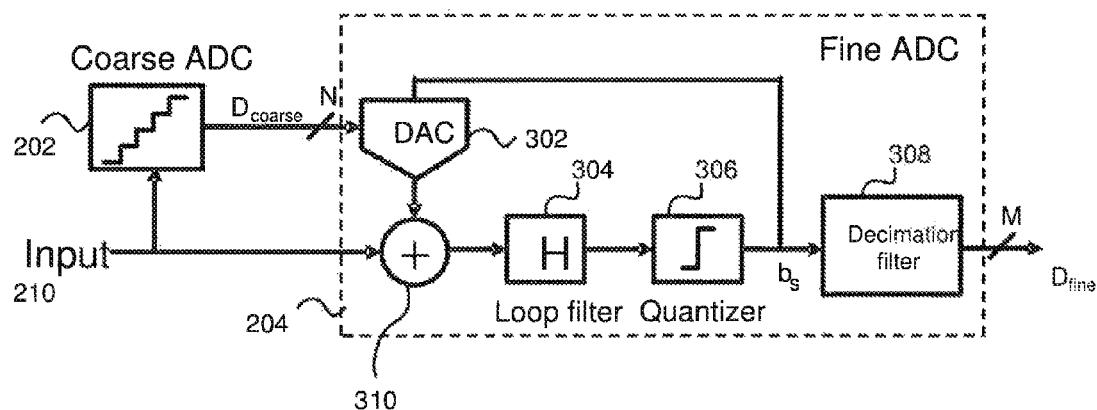
FIG. 3 is a schematic of the eADC in which a sigma delta ADC is used as a fine ADC in accordance with one or more embodiments.

FIG. 3 is a schematic of the eADC 200 illustrating the use of a Sigma Delta ADC as a fine ADC 204. The fine ADC 204 includes a digital-to-analog converter (DAC) 302 and a loop filter 304. In one embodiment, the loop filter 304 is an analog filter (either discrete time or continuous time or in some cases a hybrid of both) which determines the noise shaping behavior of a sigma delta modulator 310. In summary, the loop filter 304 allows the signal through but suppresses the quantizer's error in the band of interest. In this embodiment, the fine ADC 204 also includes a quantizer 306. The quantizer 306, in one example, is an analog-to-digital converter (1 to N bits) which gets the analog output at the end of the loop filter and converts it to digital form which is a digital representation of the signal at the input. As illustrated, a decimation filter 308 is also used. The decimation filter 308 is a digital low-pass filter. In one example, the decimation filter 308 suppresses the high frequency components of the sigma-delta modulator 310 output and generates a 20-bit (for example) code at a lower frequency output rate.

The DAC 302 is coupled to the reference signal $D_{coarse}$ from the coarse ADC 202. The output of the quantizer 306 is inputted into the DAC 302 that in turn provides an output to the subtraction node of the sigma delta modulator 310. The output of the feedback DAC 302 is a function of the output of the coarse converter $D_{coarse}$ and the output bitstream of the quantizer 306 $b_s$. In one implementation, the DAC 302 references are adjusted as a function of $D_{coarse}$, as discussed above. In some embodiments, the coarse ADC 202 runs at a sampling or operating frequency $f_{coarse} = f_{fine}/S$, where $f_{fine}$ is the sampling or operating frequency of the fine ADC 204 and S is a configurable integer. In some embodiments, the value of S can be between 2 to 100. In other words, in some embodiments, the coarse ADC 202 runs at a lower frequency than the frequency of the fine ADC 204. However, in other embodiments, the sampling frequency of the fine ADC 204 may be set to equal to the operating frequency of the coarse ADC 202. In some embodiments, the frequency $f_{coarse}$ can be dynamically set based on the frequency of the analog input signal 210.

In one embodiment, input $D_{coarse}$ may be processed prior to reaching the DAC 302. The processing of the signal $D_{coarse}$ may include setting the references of the DAC 302 as a function of the output of the coarse converter. The DAC 302 references determine the output range of the DAC 302, and, consequently, the input range of the fine ADC 204. Moreover, the accuracy of the DAC 302 references determines the accuracy of the eADC 200.

Figure 4:
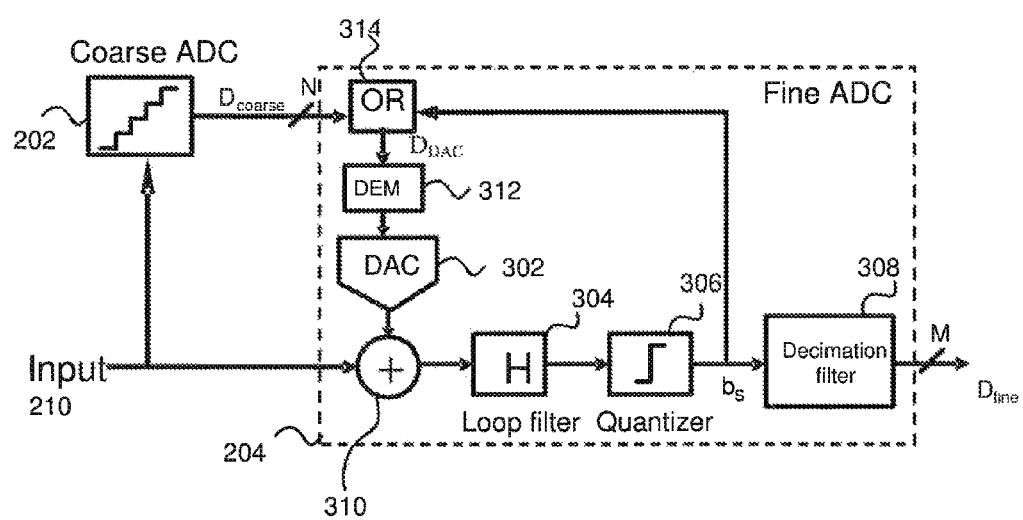
FIG. 4 is a schematic of the eADC with dynamic element matching in accordance with one or more embodiments.

FIG. 4 illustrates a schematic of the eADC 200 with dynamic element matching. In the embodiment illustrated in FIG. 4, the eADC 200 may further include a dynamic element matching module (DEM) 312. Dynamic element matching is a digital algorithm that scrambles the unit elements of the DAC 302 on each sample to linearize the DAC transfer function. A digital block 314 (OR block) is also used in conjunction with the DEM 312. The digital block 314 combines the bitstream $b_s$ and the output of the coarse ADC 202. Dynamic Element Matching techniques are described in details in "Dynamic Element Matching Techniques for Data Converters" by Jerry Wyne Bruce II, 1993.

In one example, the upper and lower references of the DAC 302 are fixed to $V_P$ and $V_N$, independent from $D_{coarse}$. The output of the coarse ADC 202 and the output bitstream $b_s$ are processed by the digital block 314 that produces the following output:

$$D_{DAC} = \alpha D_{coarse} + \beta b_s + D_{offset}$$

Where $\alpha$, $\beta$ and $D_{offset}$ are real numbers which depend on the choice of the references of the coarse ADC 202, the references of the fine ADC 204, the number of bits of the coarse ADC 202, the number of bits of the bitstream $b_s$ and the amount of over-ranging. In particular, increasing $\beta$ increases the amount of over-ranging and allows larger errors to be introduced by the coarse converter. The digital signal $D_{DAC}$ is converted into a thermometer code and randomized by the DEM 312, which drives the DAC 302.

In one example, if the references of the coarse ADC 202 are the same references ($V_P$ and $V_N$) of the DAC 302 and the bitstream $b_s$ is either 0 or 1, the following parameter values may be used: $\alpha=1$, $\beta=4$, $D_{offset}=-2$. The signal $D_{DAC}$ can be equal either to $D_{coarse}+2$ or $D_{coarse}-2$. The analog output levels of the DAC 302 corresponding to those digital values ($D_{coarse} \pm 2$) are the equivalent references of the fine ADC 204 in this example. Because of the DEM operation, any mismatch in the unitary DAC elements are averaged out and those equivalent references are generated very accurately.

In order to understand the zoom-in effect through an example, assume for example that the input range is between 0V and 4V and the coarse ADC 202 is a 3-bit ADC, which divides this range into four steps. This results in coarse quantization steps of 0.25V, 0.75V, 1.25V, 1.75V, 2.25V, 2.75V, 3.25V and 3.75V, (for digital code outputs of 0, 1, 2, 3, 4, 5, 6, 7). If the signal is 1.4V, the coarse ADC 202 outputs digital 2. The references of the fine ADC 204 will be set to 0.75V for $V_N$ and 1.75V as $V_P$. Consequently, the DAC 302 toggles between 0.75V and 1.75V instead of 0V and 4V of a classical 1-bit case. This means that, after the subtraction node 310 ($V_{signal}-V_{dac}$) the absolute value of the residual voltage will always smaller than 0.75V (assuming no errors in the coarse converter) which reduces the signal swings of the loop filter 304.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An efficient analog to digital converter, comprising:
a coarse analog to digital converter configured to receive an input analog signal, the coarse analog to digital converter configured to provide an approximate digital representation of the input analog signal,
a fine analog to digital converter coupled to receive the input analog signal, wherein the output of the coarse analog to digital converter is coupled to the fine analog to digital converter, wherein the fine analog to digital converter is configured to set input range of the fine analog to digital converter as a function of the output of the coarse analog to digital converter;
wherein the fine analog to digital converter is at least one of: a Sigma Delta Analog to Digital Converter (Sigma Delta ADC), a slope Analog to Digital Converter, or a dual-slope analog to digital converter.

2. The efficient analog to digital converter of claim 1, wherein the coarse analog to digital converter is of type Successive Approximation Analog to Digital Converter (SAR ADC).

3. The efficient analog to digital converter of claim 1, wherein the input range of the fine analog to digital converter is set by adjusting the references of the fine analog to digital converter.

4. The efficient analog to digital converter of claim 1, wherein the fine analog to digital converter is configured to run at a higher sampling frequency than a sampling frequency of the coarse analog to digital converter.

5. The efficient analog to digital converter of claim 4, wherein the sampling frequency of the fine analog to digital converter is an integer multiple of the sampling frequency of the coarse analog to digital converter.

6. The efficient analog to digital converter of claim 1, wherein a sampling frequency of the fine analog to digital converter is equal to a sampling frequency of the coarse analog to digital converter.

7. The efficient analog to digital converter of claim 1, wherein the fine analog to digital converter includes a quantizer, a loop filter and a digital to analog converter.

8. The efficient analog to digital converter of claim 7, wherein in output of the quantizer is coupled to the digital to analog converter and the output of the digital to analog converter is coupled to an input of the quantizer via a loop filter.

9. The efficient analog to digital converter of claim 7, wherein the output of the quantizer is coupled to the digital to analog converter via a dynamic element matching module.

10. The efficient analog to digital converter of claim 1, wherein a sampling frequency of the coarse analog to digital converter is dynamically set based on a frequency of the input analog signal.

11. An analog to digital converter, comprising:
- an input terminal for receiving an analog input signal;
- an input reference signal terminal for receiving a digital reference signal that is an approximate digital representation of the analog input signal;
- a digital to analog converter coupled to the input reference signal terminal; and
- a feedback loop including a quantizer that is coupled to the digital to analog converter, wherein an output of the digital to analog converter is coupled to the input of the quantizer via a loop filter;
- further including an additional digital to analog converter to generate a reference for the digital to analog converter as a function of the digital reference signal.

12. The analog to digital converter of claim 11, further including a dynamic element matching module placed between the output of the quantizer and the input of the digital to analog converter.

* * * * *